(12) United States Patent
Bolouri-Saransar et al.

(10) Patent No.: US 7,071,705 B2
(45) Date of Patent: Jul. 4, 2006

(54) APPARATUS AND METHOD FOR COMMUNICATIONS TESTING

(75) Inventors: Masud Bolouri-Saransar, Orland Park, IL (US); Michael V. Doorhy, Mokena, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/291,428

(22) Filed: Dec. 1, 2005

(65) Prior Publication Data

US 2006/0082377 A1   Apr. 20, 2006

Related U.S. Application Data

(63) Continuation of application No. 10/754,278, filed on Jan. 8, 2004, now Pat. No. 7,002,355.

(51) Int. Cl.
*G01R 27/28* (2006.01)
*G01R 31/04* (2006.01)
*G01R 31/08* (2006.01)

(52) U.S. Cl. .................. 324/628; 324/538; 324/527

(58) Field of Classification Search ............... 324/538, 324/537, 527, 628, 512, 500, 503, 520, 532, 324/76.1, 158.1, 612, 613; 714/30, 48, 734, 714/736; 379/419, 438, 433.05, 22.02; 702/119
See application file for complete search history.

(56) References Cited

U.S. PATENT DOCUMENTS

| | | | | |
|---|---|---|---|---|
| 5,030,906 A | * | 7/1991 | Duff | 324/762 |
| 5,097,213 A | * | 3/1992 | Hunting et al. | 324/538 |
| 5,241,277 A | * | 8/1993 | Kefalas | 324/538 |
| 5,420,512 A | * | 5/1995 | Spillane et al. | 324/539 |
| 5,455,515 A | * | 10/1995 | Saijo et al. | 324/538 |
| 5,539,321 A | * | 7/1996 | Sciacero et al. | 324/628 |
| 5,821,760 A | * | 10/1998 | Koeman et al. | 324/628 |
| 6,140,823 A | * | 10/2000 | Van Der Laan et al. | 324/627 |
| 6,417,672 B1 | * | 7/2002 | Chong | 324/520 |
| 6,518,745 B1 | * | 2/2003 | Kim et al. | 324/158.1 |
| 6,681,142 B1 | * | 1/2004 | Schinkowitsch | 700/108 |
| 6,725,404 B1 | * | 4/2004 | Choudhury et al. | 714/724 |
| 6,917,595 B1 | * | 7/2005 | Chang et al. | 370/248 |

\* cited by examiner

*Primary Examiner*—Anjan Deb
*Assistant Examiner*—Hoai-An D. Nguyen
(74) *Attorney, Agent, or Firm*—Robert A. McCann; Zachary J. Smolinski

(57) ABSTRACT

A communications connector tester for quickly and accurately analyzing communications connectors at production to determine whether the connectors are fit for use in certain communications applications is disclosed. Test signals at several discrete frequencies are sequentially inputted into pairs of conductors in the communications connector under test, and output signals are detected for the pairs under test. The output signals are compared to acceptable ranges for certain applications of the communications connector and the connector is passed or failed for certain applications based on the output signal values. Near-end crosstalk, far-end crosstalk, return loss, insertion loss, and other communications connector qualities may be measured using the present invention.

5 Claims, 9 Drawing Sheets

| TEST: | RETURN LOSS 1 | NEXT 1-2 | NEXT 1-3 | NEXT 1-4 | RETURN LOSS 2 | NEXT 2-3 | NEXT 2-4 | RETURN LOSS 3 | NEXT 3-4 | RETURN LOSS 4 |
|---|---|---|---|---|---|---|---|---|---|---|
| TIME PERIOD 1 | ✓ | ✓ | ✓ | ✓ | | | | | | |
| TIME PERIOD 2 | | | | | ✓ | ✓ | ✓ | | | |
| TIME PERIOD 3 | | | | | | | | ✓ | ✓ | |
| TIME PERIOD 4 | | | | | | | | | | ✓ |

*Fig. 5a*

| TEST: | ATTEN-UATION 1 | FEXT 1-2 | FEXT 1-3 | FEXT 1-4 | ATTEN-UATION 2 | FEXT 2-3 | FEXT 2-4 | ATTEN-UATION 3 | FEXT 3-4 | ATTEN-UATION 4 |
|---|---|---|---|---|---|---|---|---|---|---|
| TIME PERIOD 1 | ✓ | ✓ | ✓ | ✓ | | | | | | |
| TIME PERIOD 2 | | | | | ✓ | ✓ | ✓ | | | |
| TIME PERIOD 3 | | | | | | | | ✓ | ✓ | |
| TIME PERIOD 4 | | | | | | | | | | ✓ |

*Fig. 5b*

| TEST: | RETURN LOSS 1 | NEXT 1-2 | NEXT 1-3 | NEXT 1-4 | RETURN LOSS 2 | NEXT 2-3 | NEXT 2-4 | RETURN LOSS 3 | NEXT 3-4 | RETURN LOSS 4 |
|---|---|---|---|---|---|---|---|---|---|---|
| TIME PERIOD 1 | ✓ | ✓ | ✓ | ✓ | | | | | | |
| TIME PERIOD 2 | | | | | ✓ | ✓ | ✓ | | | |
| TIME PERIOD 3 | | | | | | | | ✓ | ✓ | |
| TIME PERIOD 4 | | | | | | | | | | ✓ |

Fig. 6

| TEST: | ATTEN-UATION 1 | FEXT 1-2 | FEXT 1-3 | FEXT 1-4 | ATTEN-UATION 2 | FEXT 2-3 | FEXT 2-4 | ATTEN-UATION 3 | FEXT 3-4 | ATTEN-UATION 4 |
|---|---|---|---|---|---|---|---|---|---|---|
| TIME PERIOD 1 | ✓ | ✓ | ✓ | ✓ | | | | | | |
| TIME PERIOD 2 | | | | | ✓ | ✓ | ✓ | | | |
| TIME PERIOD 3 | | | | | | | | ✓ | ✓ | |
| TIME PERIOD 4 | | | | | | | | | | ✓ |

*Fig. 7*

| TEST: | NEXT 1-2 | NEXT 1-3 | NEXT 1-4 | NEXT 2-3 | NEXT 2-4 | NEXT 3-4 | FEXT 1-2 | FEXT 1-3 | FEXT 1-4 | FEXT 2-3 | FEXT 2-4 | FEXT 3-4 |
|---|---|---|---|---|---|---|---|---|---|---|---|---|
| TIME PERIOD 1 | ✓ | ✓ | ✓ | | | | ✓ | ✓ | ✓ | | | |
| TIME PERIOD 2 | | | | ✓ | ✓ | | | | | ✓ | ✓ | |
| TIME PERIOD 3 | | | | | | ✓ | | | | | | ✓ |

Fig. 8

APPARATUS AND METHOD FOR COMMUNICATIONS TESTING

CROSS-REFERENCE TO RELATED APPLICATION

This application is a continuation of U.S. patent application Ser. No. 10/754,278, filed on Jan. 8, 2004 and issued as U.S. Pat. No. 7,002,355, the entirety of which is hereby incorporated by reference.

FIELD OF THE INVENTION

The present invention relates generally to communications and more specifically to a method of testing communications connectors quickly and accurately at production.

BACKGROUND OF THE INVENTION

Communications connectors, where communication lines are connected to each other and to network devices, represent an increasingly important aspect of the communications industry. Communications connectors may include pairs of conductors which are used as connection terminals for conductive twisted-pair communications cables. Though connectors are necessary parts of a communications connection, they introduce a certain amount of signal degradation into communications signals. One type of signal degradation introduced by a connector is near-end crosstalk (NEXT), an error signal resulting from interference between pairs in the connectors, with the error signal propagating backward from the direction of signal flow into the connector. Far-end crosstalk (FEXT) is similarly caused by interference between pairs and propagates in the direction of signal flow through the connector. A third type of signal degradation, return loss (RL) represents reflection of signal backward from the connector due to impedance mismatches. Insertion loss is a fourth type of signal degradation that represents signal loss through the connector in the direction of signal flow.

As the bandwidth of communications rises, the need for high-quality communications connectors meeting tight requirements for reducing these types of signal degradation increases. Concurrent with the increasing demands on connector quality, the need for consistent testing of connectors to verify their suitability is increasing. One method for detecting the amount of signal degradation introduced by a connector is to analyze a connector using a network analyzer. A network analyzer contains a transmitting port, which sends a test signal through a connector or other device under test (DUT), and a receiving port, which receives signal from the connector. Electronics within the network analyzer analyze the returned signal relative to the transmitted signal and generate information about NEXT, FEXT, RL, and insertion loss sufficient to determine the suitability of the connector.

Though network analyzers are accurate, they have significant drawbacks. One drawback of network analyzers is their speed. One NEXT test in a common network analyzer takes approximately three seconds, and six tests must be performed for each eight-conductor connector (one test each for conductors one and two, one and three, one and four, two and three, two and four, and three and four). Thus, even assuming zero time for changing pairs under test, a single connector will take eighteen seconds to test for NEXT using a network analyzer. Because the time delay for testing using a network analyzer is longer than the time for production of a connector, production line testing of all manufactured connectors using a network analyzer is impractical.

Another shortcoming of connector testing using network analyzers is that network analyzers generally operate in the common mode of signal transfer rather than in a differential mode. Communication connectors are generally designed to work in a differential mode. This difference requires the use of a balun when testing connectors using a network analyzer. A balun is a device that converts a common mode signal to a differential mode signal, and it adds a certain amount of noise and error into the test results.

Because of these and other shortcomings of current connector test devices and methods, there exists a need for a fast and accurate test procedure and system for analyzing communication connectors.

SUMMARY OF THE INVENTION

The present invention includes a communications connector testing system and method for testing communications connectors for compliance with standards at speeds approximately equal to the speed of production of the communications connector.

Preferably, a communications connector testing system and method tests communications connectors for one or more of return loss, insertion loss, near-end crosstalk, and far-end crosstalk resulting from test signals input into the communications connectors.

According to one embodiment of the present invention, a communications testing system includes one or more oscillators for generating test signals and inputting the test signals into a communications connector. Near-end detectors detect signals flowing opposite the direction of test signal flow. Far-end detectors may be included to detect signals flowing away from the communications connector. A microcontroller accepts signals from the near-end detectors to determine values for near-end crosstalk and return loss. The microcontroller may be further adapted to accept signals from the far-end detectors to determine values for far-end crosstalk and insertion loss. These values, either standing alone or in combination, are compared to acceptable values, and the communications connector under test is evaluated for suitability based on this comparison.

Test signals and measurements may be emitted and taken sequentially to assure rapid evaluation of communications connectors under test.

BRIEF DESCRIPTION OF THE DRAWINGS

The foregoing and other advantages of the invention will become apparent upon reading the following detailed description and upon reference to the drawings in which:

FIG. 5 is a chart showing measurements made by time period for a four-pair communications connector tested for return loss, near-end crosstalk, insertion loss, and far-end crosstalk;

FIG. 6 is a chart showing measurements made by time period for a four-pair communications connector tested for return loss and near-end crosstalk only;

FIG. 7 is a chart showing measurements made by time period for a four-pair communications connector tested for far-end crosstalk and insertion loss only; and FIG. 8 is a chart showing measurements made by time period for a four-pair communications connector tested for near-end crosstalk and far-end crosstalk only.

Figure 1:
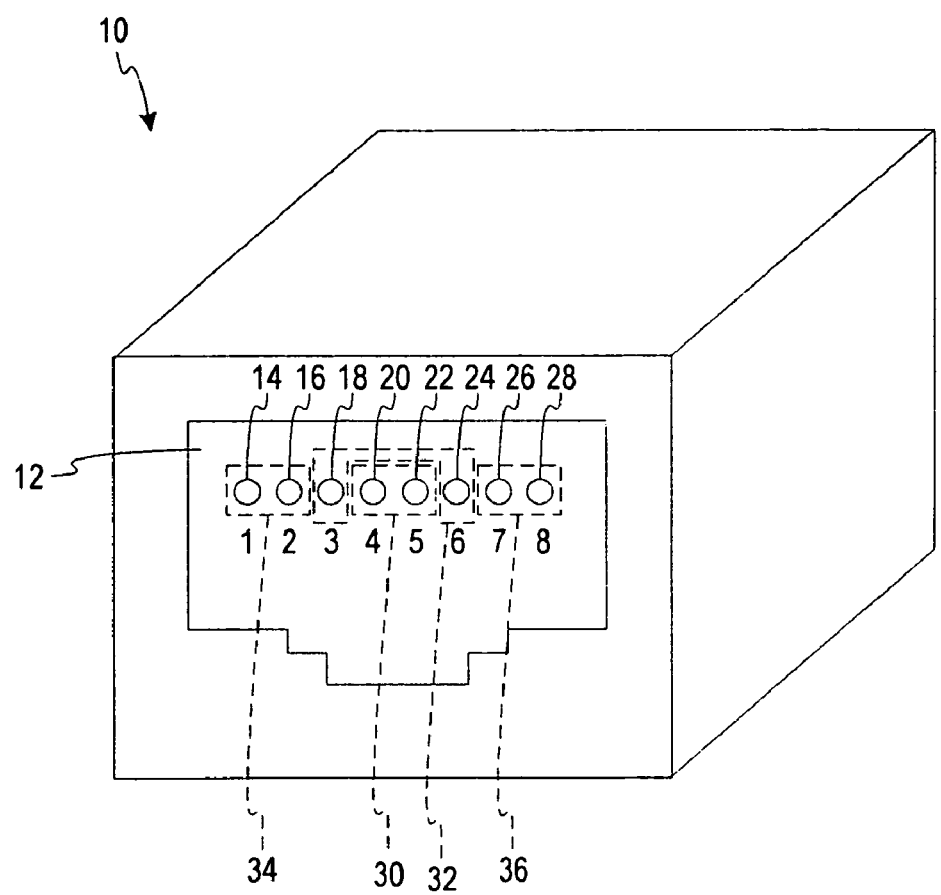
FIG. 1 is a communications connector for use with the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

DESCRIPTION OF SPECIFIC EMBODIMENTS

The present invention is directed to quickly and accurately testing communications connectors. The principles of the present invention may be applied to the testing of a variety of communications connectors, including communications jacks, cables, and plugs.

FIG. 1 shows an example of a communications connector 10 that may be tested under the present invention. Although the present invention will be described with respect to a four-pair communications connector 10, the present invention may be modified to test communications connectors with more or fewer conductor pairs. The communications connector 10 includes a socket 12 which contains eight contacts: a first contact 14, a second contact 16, a third contact 18, a fourth contact 20, a fifth contact 22, a sixth contact 24, a seventh contact 26, and an eighth contact 28.

For the purpose of communicating signals, the contacts may be grouped into four pairs. According to one method for ordering the pairs of conductors, a first contact pair 30 includes the fourth and fifth contacts 20 and 22, a second contact pair 32 includes the third and sixth contacts 18 and 24, a third contact pair 34 includes the first and second contacts 14 and 16, and a fourth contact pair 36 includes the seventh and eighth contacts 26 and 28.

According to some embodiments of the present invention, communications connectors may be tested at a number of discrete frequencies. Because error response is approximately linear by frequency, test results at discrete frequencies can be generalized to determine whether a particular communications connector is fit for a specific purpose. According to one embodiment of the present invention, a communications connector test method and device is designed to determine whether communications connectors under test comply with the specifications for ANSI/EIA (American National Standards Institute/Electronic Industries Association) Standard 568 Category 6 ("CAT 6") communications connections.

Figure 2:
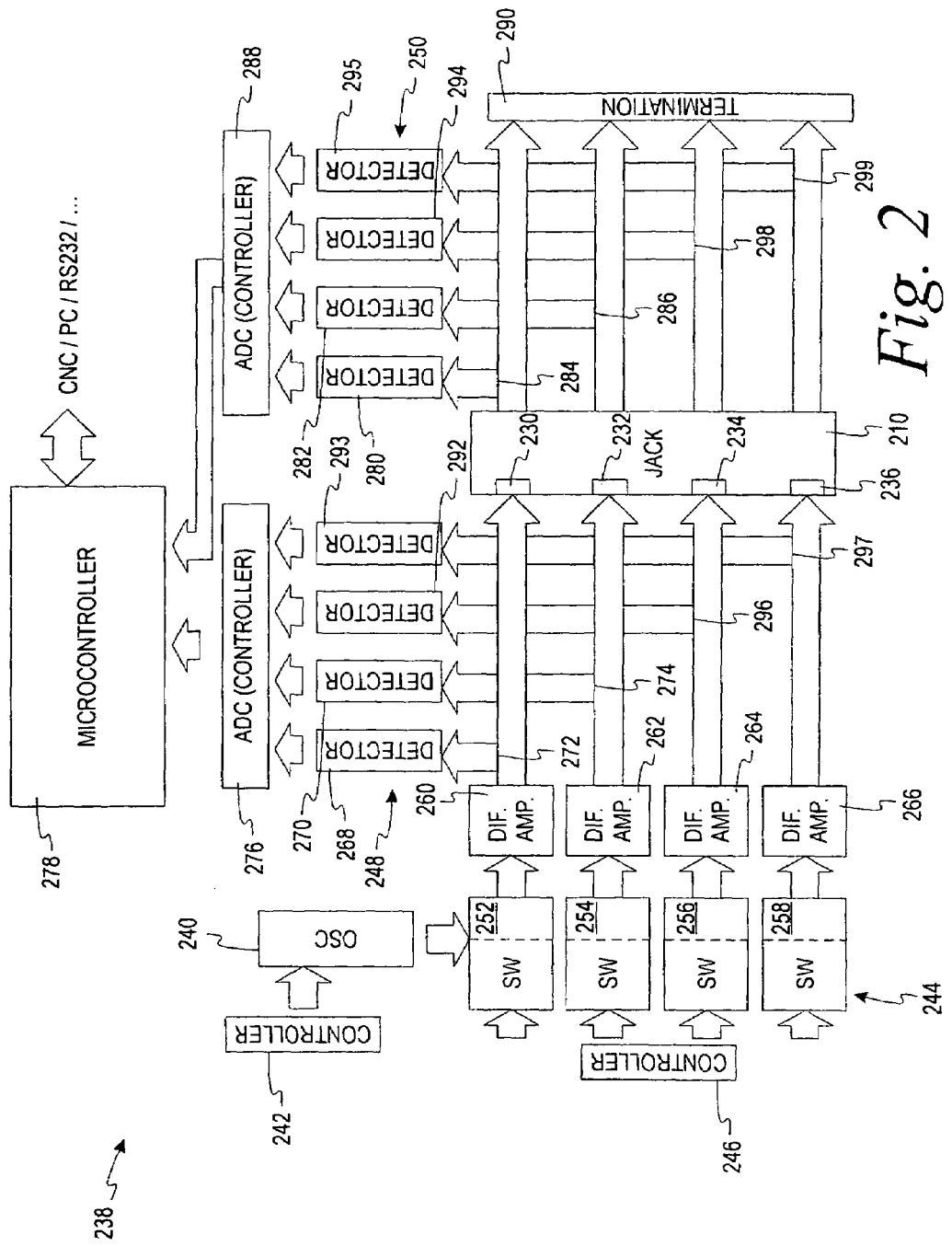
FIG. 2 is a block diagram of a communications connector test device according to one embodiment of the present invention.

Turning now to FIG. 2, a test system 238 addressing the problems associated with quickly and accurately testing communications connectors is shown as a block diagram. The test system 238 of FIG. 2 is designed to test communications errors likely to result during use of a particular communications connector 210. In some embodiments, the connector 210 may be the connector 10 illustrated in FIG. 1. However, as mentioned above, the present invention is not limited to connector 10 but instead includes other connector configurations and numbers of conductors. In the embodiment shown in FIG. 2, a test system according to the present invention can test for NEXT, return loss, FEXT, and insertion loss. The test system 238 uses an oscillator 240, which may be controlled by a separate oscillator controller 242, to send test signals at certain frequencies to a switch array 244, which may in turn be controlled by a switch array controller 246. For example, the oscillator 240 may initiate testing by sending a test signal at 10 MHz to the switch array 244.

The switch array 244 is designed to forward test signals to contact pairs of the communications connector 210. Once the test process has been initiated, a near-end detector array 248 and a far-end detector array 250 operate to detect resulting signals from the communications connector 210. Results from the near-end detector array 248 and the far-end detector array 250 may be processed as individual results from individual detectors so that specific information can be gleaned as to which contact pairs of the communications connector 210 generate error signals that fall outside acceptable ranges.

According to one embodiment of the test system 238, the switch array 244 includes four switches: a first switch 252, a second switch 254, a third switch 256, and a fourth switch 258. Each of these switches forwards the input test signal to an associated differential amplifier, which amplifies the signal for input into a contact pair of the communications connector 210. In the embodiment shown in FIG. 2, a first amplifier 260, a second amplifier 262, a third amplifier 264, and a fourth amplifier 266 are provided.

Each of the contact pairs is tested for the error signal caused by its interactions with each of the other contact pairs. Because error, such as FEXT, induced in a second pair due to signal input into a first pair is the same as error in the first pair due to signal input into the second pair, there is no need to re-test a pair that has already been tested by inputting a signal into the second pair and detecting the result in the first pair. For example, if a test signal has been inputted into the first contact pair 230 and error results have been detected in the second contact pair 232, there is no need to input the test signal into the second contact pair 232 and test the results at the first contact pair 230, as this would be an effective duplication of the measurement just completed.

In the example in which the oscillator 240 first sends a test signal at 10 MHz to the switch array 244, the switch array 244 operates using the first switch 252 to forward the test signal to the first amplifier 260 and onward to the first contact pair 230 of the communications connector 210. With the test signal being inputted into the first contact pair 230, a first near-end detector 268 and a second near-end detector 270 are activated to detect backward-propagating signals, respectively, from the first contact pair 230 and the second contact pair 232. The detection of backward-propagating signal is accomplished using first and second near-end directional couplers 272 and 274 adapted to capture the backward-propagating signal and forward this signal, respectively, to the first and second near-end detectors 268 and 270. When the test signal is forwarded to the first contact pair 230, the signal detected by the first near-end detector 268 allows an analysis of return loss, and the signal detected by the second near-end detector 270 allows an analysis of near-end crosstalk between the first contact pair 230 and the second contact pair 232.

The detected signal is forwarded to a near-end analog-to-digital converter and controller 276, which converts the signal to a format that can be analyzed by a microcontroller 278. The microcontroller 278 collects incoming information to compare against standards for operation of an acceptable communications connector, thereby enabling a decision as to whether a particular communications connector passes or fails a test. The microcontroller 278 may make the comparison in combination with a computer connected via a CNC, a PC, or an RS232 connection as shown in FIG. 2. According to some embodiments of the present invention, a microcontroller may make comparisons and activate the production equipment in response to the comparisons. As one example of a possible error reading, a 1.0 V test signal input into the first contact pair 230 may induce a 0.5 V crosstalk signal at the second contact pair 232. The microcontroller 278 would then compare to 0.5 V crosstalk signal to a reference voltage to determine whether or not the level of crosstalk meets a given standard and hence to determine whether the connector is acceptable.

Continuing the example of a 10 MHz test signal being forwarded to the first contact pair 230, to complete the detection as to the first and second contact pairs 230 and 232 using far-end information, a first far-end detector 280 and a second far-end detector 282 are utilized to detect signals propagating along far-end signal paths. The first far-end detector 280 measures a signal from a first far-end directional coupler 284, and the second far-end detector 282 measures a signal from a second far-end directional coupler 286. The first and second far-end directional couplers 284 and 286 are adapted to measure a signal propagating away from the communications connector 210. Signal at the first far-end directional coupler 284 may be used to determine insertion loss through the first contact pair 230, and signal at the second far-end directional coupler 286 may be used to determine far-end crosstalk between the first and second contact pairs 230 and 232. According to one embodiment of the present invention, the signals captured by detectors in the far-end detector array are forwarded to a far-end analog-to-digital converter and controller 288, which converts the received signal and sends the converted signal to the microcontroller 278. In the embodiment of FIG. 2, which is designed to analyze near-end and far-end signals, the far-end signals terminate at a termination 290.

Simultaneously with detection and analysis of the near-end and far-end signals relating to the first and second contact pairs 230 and 232, the test system 238 analyzes signals resulting from the interaction of the first and third contact pairs 230 and 234 and from the interaction of the first and fourth contact pairs 230 and 236. That is, when the first switch 252 is activated to forward test signal to the first contact pair 230, interaction of the first contact pair 230 can be measured in connection with the third and fourth contact pairs 234 and 236 simultaneous with measurement of the interaction with the second contact pair 232 and the return loss and insertion loss associated with the first contact pair 230. To analyze the interaction between the first and third contact pairs 230 and 234, the first switch 252 is activated to forward test signal to the first contact pair 230, and a third near-end detector 292 and a third far-end detector 294 detect signal captured, respectively, by a third near-end directional coupler 296 and a third far-end directional coupler 298. Near-end and far-end interactions between the first and third contact pairs 230 and 234 proceed as described above with respect to the first and second contact pairs 230 and 232.

To analyze the interaction between the first and fourth contact pairs 230 and 236, while the first switch 252 is activated to forward test signal to the first contact pair 230, a fourth near-end detector 293 and a fourth far-end detector 295 detect signal captured, respectively, from a fourth near-end directional coupler 297 and a fourth far-end directional coupler 299.

After the interactions between the first contact pair 230 and the second, third, and fourth contact pairs 232, 234, and 236 have been detected and recorded, the test system 238 may proceed to alter the frequency at which a test signal is input into the first contact pair 230 or maintain the same frequency and progress to input the test signal into the second contact pair 232. If the test signal frequency is altered, testing proceeds as described above, but with a different test frequency, such as 100 MHz.

Following input of the test signal into the first contact pair 230 and collection of resulting signals from the first, second, third, and fourth contact pairs 230, 232, 234, and 236, the test system 238 has tested three of six possible interactions in a four-pair communications connector 210. To test the remaining interactions, test signals must be sent to different contact pairs. To test the interaction between the second contact pair 232 and the third and fourth contact pairs 234 and 236, the second switch 254 is activated and the first switch 252 is deactivated. When the second switch 254 is activated, the test signal is amplified by the second amplifier 262 and forwarded to the second contact pair 232.

Testing of the interactions between the second contact pair 232 and the third and fourth contact pairs 234 and 236 proceeds similarly to the interaction testing as described above. The second near-end detector 270 detects backward-propagating signal to test for return loss when the test signal is forwarded to the second contact pair 232. The third and fourth near-end directional couplers 296 and 297, respectively, forward backward-propagating signal to the third and fourth near-end detectors 292 and 293 for an analysis of induced near-end crosstalk. The second far-end detector 286 detects forward-propagating signal to test for insertion loss. The third and fourth far-end directional couplers 298 and 299, respectively, send forward-propagating signal to the third and fourth far-end detectors 294 and 295 for an analysis of far-end crosstalk.

Following the input of test signal into the second contact pair 232, with signal capture and analysis as discussed above, five of the possible six interactions in a four-jack communications connector have been tested. Next, the third switch 256 is activated and the second switch 254 is deactivated to enable test signal to be amplified by the third amplifier 264 and enter the third contact pair 234. With signal entering the third contact pair 234, the third near-end directional coupler 296 sends backward-propagating signal to the third near-end detector 292 for an analysis of return loss at the third contact pair 234, and the third far-end directional coupler 298 sends forward-propagating signal to the third far-end detector 294 for an analysis of insertion loss at the third contact pair 234. The fourth near-end directional coupler 297 forwards backward-propagating signal to the fourth near-end detector 293 for analysis of near-end crosstalk between the third and fourth contact pairs 234 and 236, and the fourth far-end directional coupler 299 sends signal to the fourth far-end log detector 295 for detection and analysis of far-end crosstalk between the third and fourth contact pairs 234 and 236.

Following testing of crosstalk, return loss, and insertion loss with respect to the first, second, and third contact pairs, test signal is input into the fourth contact pair 236 for a measurement of return loss and insertion loss caused by the fourth contact pair 236. The fourth switch 258 is activated, the third switch 256 is deactivated, and the test signal is amplified by the fourth amplifier 266 and directed to the fourth contact pair 236. The fourth near-end directional coupler 297 forwards backward-propagating signal to the fourth near-end detector 293 for detection and analysis of return loss at the fourth contact pair 236, and the fourth far-end directional coupler 299 sends forward-propagating signal to the fourth far-end detector 295 for detection and analysis of insertion loss at the fourth contact pair 236.

If test signal has been input into all four contact pairs and testing has been conducted with respect to one frequency, the oscillator controller 42 may activate the oscillator 40 at a new frequency for re-testing of the communications connector 10 at the second frequency. According to one embodiment of the present invention, testing is conducted at four discrete frequencies, though testing using more or fewer frequencies for each communications connector is contemplated.

Figure 3:
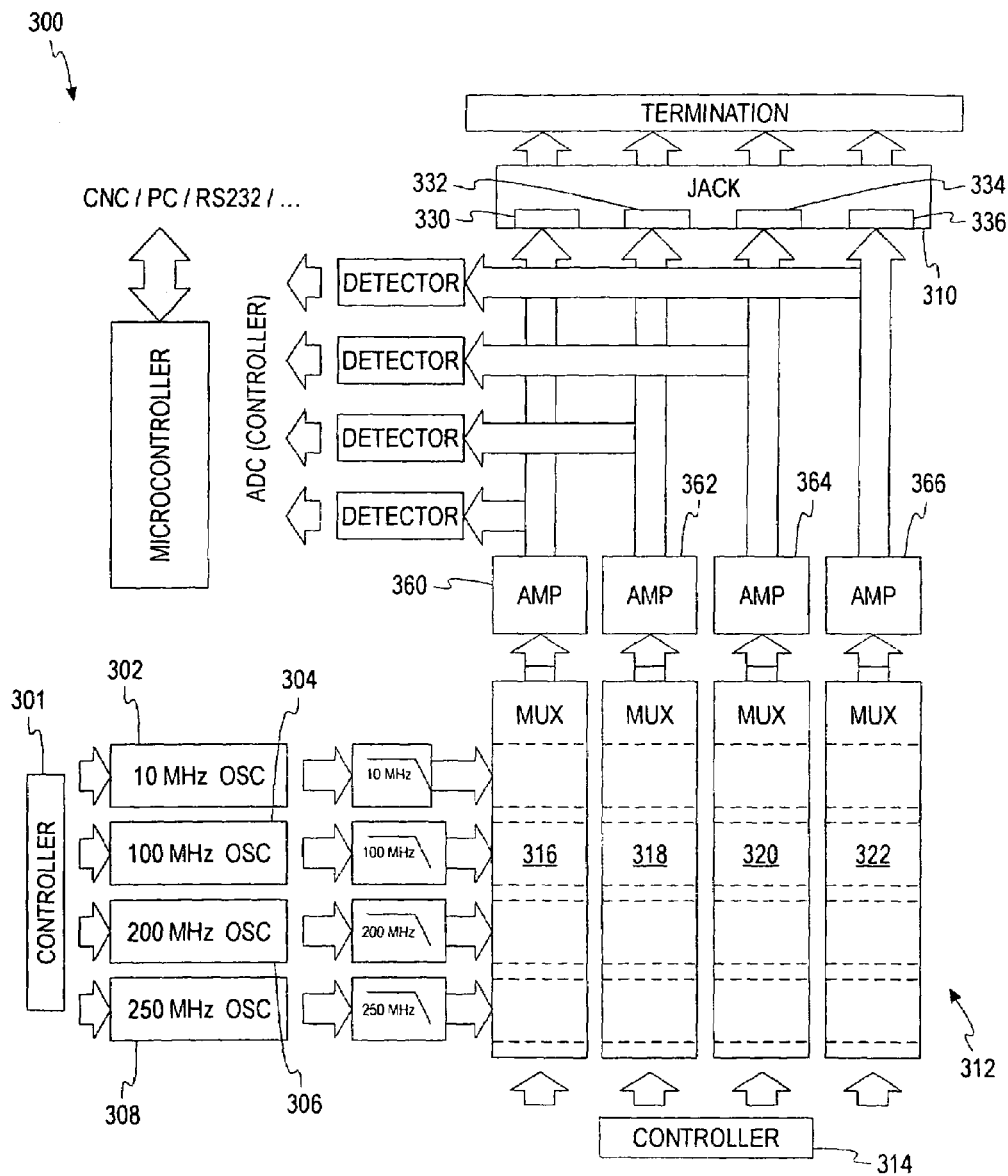
FIG. 3 is a block diagram of a communications connector test device according to another embodiment of the present invention.

Turning now to FIG. 3, an alternative embodiment of a test system 300 according to the present invention is shown. In the embodiment shown in FIG. 3, an oscillator controller 301 controls the operation of several discrete oscillators. These oscillators are designed to operate by sending test signals continuously at selected discrete frequencies. In the embodiment shown in FIG. 3, a first oscillator 302 emits a test signal at a frequency of 10 MHz, a second oscillator 304 emits a test signal at a frequency of 100 MHz, a third oscillator 306 emits a test signal at a frequency of 200 MHz, and a fourth oscillator 308 emits a test signal at a frequency of 250 MHz. Oscillators emitting test signals at greater or lesser frequencies may be used in alternative embodiments. Each of these signals is sent to a multiplexer array 312 designed to select test signals and send the test signals to contact pairs at a communications connector 310. The multiplexer array 312 may be controlled by a multiplexer controller 314, which directs test signals to contact pairs in a sequence. A first multiplexer 316 directs the a signal to a first amplifier 360, a second multiplexer 318 directs the test signal to a second amplifier 362, a third multiplexer 320 directs the test signal to a third amplifier 364, and a fourth multiplexer 322 directs the test signal to a fourth amplifier 366. The amplifiers amplify the test signal and direct the test signal to respective contact pairs 330, 332, 334, and 336 of the communications connector 310.

Aside from the use of multiple oscillators and a multiplexer array to generate and direct the test signals, the embodiment shown in FIG. 3 operates similarly to the embodiment shown in FIG. 2. The specific embodiment shown in FIG. 3 is designed to measure only return loss and near-end crosstalk, and is not shown with far-end detectors for measuring insertion loss and far-end crosstalk, though an embodiment of the present invention using multiple oscillators and multiplexers and adapted to measure near-end and far-end signals is contemplated. Further, an embodiment of the present invention using a single, switched oscillator and measuring only near-end crosstalk and return loss is contemplated Using test devices and methods according to the present invention, communications connectors can be tested very rapidly at production to determine whether the connectors meet the requirements of certain communications specifications. For testing CAT 6 compliance, it is preferred to have a range of test frequencies between one and 250 MHz, and four test frequencies spaced along this range have been found to be beneficial. A test system according to one embodiment of the present invention is capable of testing all communications connectors produced at a production line for compliance with CAT 6 standards for NEXT and return loss.

For a connector to meet the Category 6 connector specification, it must meet the following criteria. The near-end crosstalk (NEXT) performance must be greater then $-54-20*\log(F/100)$ in dB for a frequency range of 1 to 250 MHz, with F as the frequency at any specific point in MHz. The far-end crosstalk (FEXT) performance must be greater then $-43-20*\log(F/100)$ in dB for a frequency range of 1 to 250 MHz. The return loss performance must be greater then $-30$ dB for a frequency range of 1 to 50 MHz and greater then $-24-20*\log(F/100)$ in dB for the frequency range of 50 to 250 MHz. Finally, the insertion loss performance must be less then $0.02*\mathrm{sqrt}(F)$ in dB for the frequency range from 1 to 250 MHz Again, F is the frequency at any specific point in MHz.

Because oscillators used in the present invention are not required to sweep through frequencies, the previously-known testing requirement for a phase-locked loop synthesizer is no longer necessary. Further, the testing systems and methods of the present invention allow for simultaneous testing of multiple contact pairs in a connector without the need for physical switching of sensing from pair to pair, as when a network analyzer is employed. Though the present invention has been described with respect to testing a connector jack, it is to be appreciated that the principles of the present invention could be applied to the testing of connectors in patch cords, patch panels, wall plates, face plates, insulation displacement "110 blocks," and to the testing of communication cable.

Figure 4:
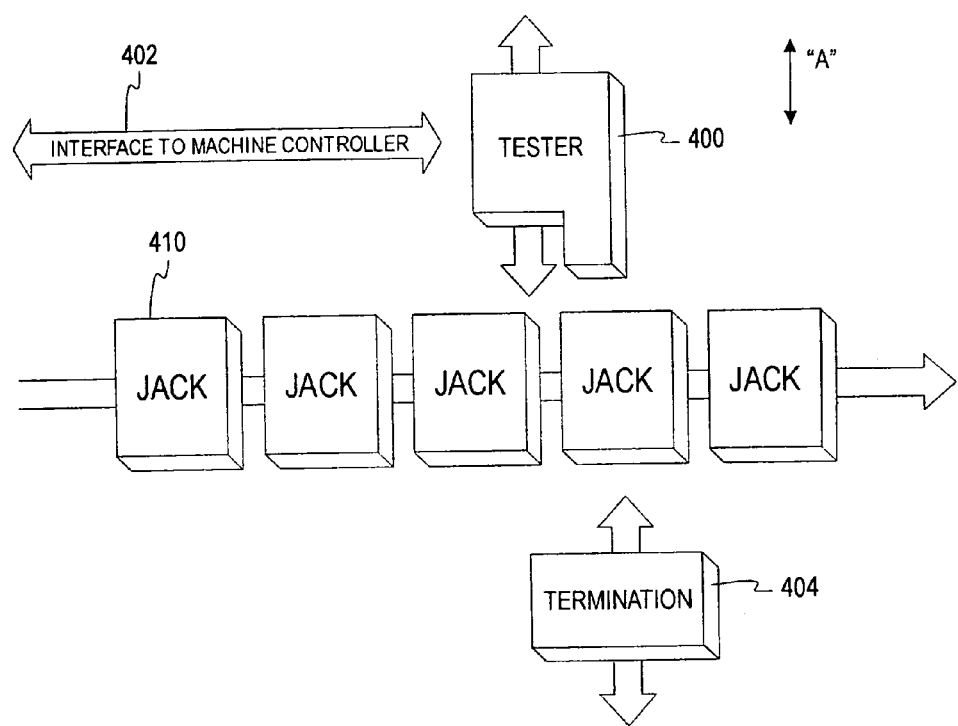
FIG. 4 is a block diagram showing the incorporation of a communications connector test device into a connector production line according to one embodiment of the present invention.

Because of the test speed enabled by the present invention, testing for communication connector compliance with standards can be done for each communication connector produced on a production line, allowing a test system to be integrated into the production line as shown in FIG. 4. FIG. 4 shows a tester 400 adapted to test a series of communications connectors. According to one embodiment of the present invention, communications connectors are tested as they are produced on a production line. A machine controller interface 402 allows results from the tester to be used to halt production when a series of errors are discovered by the tester 400, to alter production, or to remove particular communications connectors 410 from production when significant faults have been discovered. The tester 400 and a termination 404 are designed to reciprocate in the direction shown by arrow "A" of FIG. 4 to enable connection and disconnection with communications connectors under test. FIG. 4 shows near-end crosstalk and/or return loss testing only; according to an alternative embodiment, another tester is coupled between the termination 404 and connectors 410 to be tested to permit measurement of far-end crosstalk and/or insertion loss if desired. A test system according to some embodiments of the present invention enables testing of communications connectors using differential mode signals, with no need to convert test signals to the common mode. According to one embodiment of the present invention, problems with communication connector production are identified during production, so that communications connectors not meeting specifications will be identified and rejected. Further, changes to improve performance may be made during production.

Turning now to FIGS. 5–8, charts showing time periods necessary to make certain measurements according to some embodiments of the present invention are shown. The charts of FIGS. 5–8 show time periods along the leftmost column and measurements made along the top row, with indicators at the intersections to show which measurements are made during which time periods.

FIG. 5 shows the measurements made during four time periods in an embodiment in which a communications connector with four contact pairs is tested for return loss, near-end crosstalk (NEXT), insertion loss, and far-end crosstalk (FEXT). Four test time periods, representing the sequential input of test signals into pairs and the simultaneous reading of signals resulting from the test signal, are necessary to make the measurements in this embodiment. In the first time period, return loss and insertion loss resulting from pair one, and NEXT and FEXT resulting from the interaction between pair one and pairs two, three, and four are measured. In the second time period, return loss and insertion loss resulting from pair two, and NEXT and FEXT resulting from the interaction between pair two and pairs three and four are measured. In the third time period, return loss and insertion loss resulting from pair three, and NEXT and FEXT resulting from the interaction between pairs three and four are measured. In the fourth time period, return loss and insertion loss resulting from pair four are measured.

FIG. 6 shows the measurements made when a communications connector having four contact pairs is measured for NEXT and return loss only. Four time periods are required in this embodiment. In the first time period, return loss resulting from pair one and NEXT resulting from the interaction between pair one and pairs two, three, and four are measured. In the second time period, return loss resulting from pair two, and NEXT resulting from the interaction between pair two and pairs three and four are measured. In the third time period, return loss resulting from pair three, and NEXT resulting from the interaction between pairs three and four are measured. In the fourth time period, return loss resulting from pair four is measured.

FIG. 7 shows the measurements made when a communications connector having four contact pairs is measured for FEXT and insertion loss only. Again, four time periods are required in this embodiment. In the first time period, insertion loss resulting from pair one and FEXT resulting from the interaction between pair one and pairs two, three, and four are measured. In the second time period, insertion loss resulting from pair two and FEXT resulting from the interaction between pair two and pairs three and four are measured. In the third time period, insertion loss resulting from pair three and FEXT resulting from the interaction between pairs three and four are measured. In the fourth time period, insertion loss resulting from pair four is measured.

FIG. 8 shows the measurements made when a communications connector having four contact pairs is measured for NEXT and FEXT only. Only three time periods are required in this embodiment. In the first time period, NEXT and FEXT resulting from the interaction between pair one and pairs two, three, and four are measured. In the second time period, NEXT and FEXT resulting from the interaction between pair two and pairs three and four are measured. In the third time period, NEXT and FEXT resulting from the interaction between pairs three and four are measured.

Generalizing to the time periods required when measuring communications connectors having different numbers of pairs of conductors, when measurements of NEXT only, FEXT only, or NEXT and FEXT are made, the number of time periods (T) required for testing a communications connector having P pairs is:

$T=P-1.$

For a test procedure measuring return loss or insertion loss, or both, either alone or in combination with NEXT and/or FEXT, the number of time periods required is:

$T=P.$

According to some embodiments of the present invention, testing time periods range from approximately 0.125 seconds to approximately 0.250 seconds, though it is to be understood that alternative time period ranges may be employed in specific embodiments of the present invention. For example, time periods ranging from approximately 0.1 seconds to approximately 0.5 seconds, or from 0.250 seconds to approximately 1.0 seconds, may be advantageous in some embodiments of the present invention.

In addition to the ability to accept or reject the communications connector based upon the testing results without stopping or slowing the production thereof, it is also useful as a process monitoring system. By testing each connector during the production process if the results are moving in the direction of failure, connections may be able to be implemented prior to the actual failure of any product thus avoiding the associated waste involved.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A system for testing a communications connector having a plurality of contact pairs comprising:
   an oscillator adapted to produce a test signal;
   a switch array having first and second switches, coupled to said oscillator and adapted to receive said test signal;
   a first amplifier coupled to said switch array and adapted to amplify said test signal;
   a second amplifier coupled to said switch array and adapted to amplify said test signal;
   a tester comprising a first contact pair connected to a first test signal input path and a second contact pair connected to a second test signal input path, said first contact pair adapted to receive said test signal from said first amplifier via said first test signal input path, said second contact pair adapted to receive said test signal from said second amplifier via said second test signal input path;
   a first near-end detector coupled to said first test signal input path via a first near-end directional coupler adapted to couple signal flowing in a direction opposite the direction of test signal flow, said first near-end detector detecting a return loss signal and generating a first near-end detector signal;
   a second near-end detector coupled to said second test signal input path via a first near-end directional coupler adapted to couple signal flowing in a direction opposite the direction of test signal flow, said second near-end detector detecting a near-end crosstalk signal and generating a second near-end detector signal;
   a near-end analog-to-digital converter adapted to receive said first near-end detector signal and said second near-end detector signal, to convert the first near-end detector signal to a converted first near-end detector signal, and to convert the second near-end detector signal to a converted second near-end detector signal; and
   a microcontroller adapted to receive said converted first near-end detector signal and said converted second near-end detector signal and to generate a first contact pair return loss value based on said converted first near-end detector signal and further to generate a first and second contact pair near-end crosstalk value based on said converted second near-end detector signal.

2. The system of claim 1 further comprising:
- a far-end termination coupled to said first and second contact pairs, respectively, along first and second far-end signal paths;
- a first far-end detector coupled to said first far-end signal path via a first far-end directional coupler adapted to couple signal flowing in the direction of test signal flow, said first far-end detector generating a first far-end signal;
- a second far-end detector coupled to said second far-end signal path via a second far-end directional coupler adapted to couple signal flowing in the direction of test signal flow, said second far-end detector generating a second far-end signal; and
- a far-end analog-to-digital converter adapted to receive said first far-end detector signal and said second far-end detector signal, to convert the first far-end detector signal to a converted first far-end detector signal, and to convert the second far-end detector signal to a converted second far-end detector signal;

wherein said microcontroller is further adapted to receive said converted first far-end detector signal and said converted second far-end detector signal and to generate a first contact pair insertion loss value based on said first far-end detector signal and further to generate a first and second contact pair far-end crosstalk value based on said converted second far-end detector signal.

3. The system of claim 1 wherein said oscillator is adapted to produce a plurality of test signals at a plurality of test frequencies.

4. The system of claim 1 wherein said oscillator is adapted to produce said test signal in differential mode and wherein said test signal in differential mode is input into said tester.

5. The system of claim 3 wherein said near-end analog-to-digital converter is adapted to accept said test signal in differential mode.

* * * * *

UNITED STATES PATENT AND TRADEMARK OFFICE
CERTIFICATE OF CORRECTION

| | | |
|---|---|---|
| PATENT NO. | : 7,071,705 B2 | Page 1 of 1 |
| APPLICATION NO. | : 11/291428 | |
| DATED | : July 4, 2006 | |
| INVENTOR(S) | : Masud Bolouri-Saransar et al. | |

It is certified that error appears in the above-identified patent and that said Letters Patent is hereby corrected as shown below:

Column 7, Line 32, "the a signal" should be --the test signal--.

Column 7, Line 67, "greater then" should read --greater than--.

Column 8, Line 3, "greater then" should read --greater than--.

Column 8, Line 5, "greater then" should read --greater than--.

Column 8, Line 6, "greater then" should read --greater than--.

Column 8, Line 9, "less then" should read --less than--.

Signed and Sealed this

Thirty-first Day of October, 2006

JON W. DUDAS
*Director of the United States Patent and Trademark Office*